(12) United States Patent
Nakamura et al.

(10) Patent No.: US 9,711,440 B2
(45) Date of Patent: Jul. 18, 2017

(54) WIRING BOARD AND METHOD FOR MANUFACTURING THE SAME

(71) Applicant: IBIDEN CO., LTD., Ogaki-shi (JP)

(72) Inventors: Takenobu Nakamura, Ogaki (JP); Koji Miura, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/935,749

(22) Filed: Nov. 9, 2015

(65) Prior Publication Data
US 2016/0133555 A1 May 12, 2016

(30) Foreign Application Priority Data

Nov. 7, 2014 (JP) ................................. 2014-227092

(51) Int. Cl.
H01L 23/498 (2006.01)
H01L 21/48 (2006.01)
H05K 3/42 (2006.01)
H05K 3/46 (2006.01)

(52) U.S. Cl.
CPC ....... H01L 23/49822 (2013.01); H05K 3/427 (2013.01); H05K 3/4602 (2013.01); H01L 21/486 (2013.01); H01L 21/4857 (2013.01); H01L 23/49827 (2013.01); H01L 23/49894 (2013.01); H01L 2924/0002 (2013.01); H05K 3/4652 (2013.01); H05K 2201/09563 (2013.01)

(58) Field of Classification Search
CPC ......... H01L 23/49822; H01L 23/49827; H01L 23/49838; H01L 23/49894; H01L 21/4857; H01L 21/486
See application file for complete search history.

(56) References Cited

U.S. PATENT DOCUMENTS

| 6,291,259 B1 * | 9/2001 | Chun | H01L 23/055 257/678 |
| 2005/0258522 A1 * | 11/2005 | En | C23G 1/10 257/670 |
| 2008/0014336 A1 * | 1/2008 | Asai | H01L 23/145 427/97.6 |
| 2011/0240351 A1 | 10/2011 | Wakita et al. | |

FOREIGN PATENT DOCUMENTS

WO  WO 2011/122246 A1  10/2011

* cited by examiner

Primary Examiner — Peniel M Gumedzoe
(74) Attorney, Agent, or Firm — Oblon, McClelland, Maier & Neustadt, L.L.P.

(57) ABSTRACT

A wiring board includes a core substrate including an insulating layer and a conductor layer formed on the insulating layer, and a build-up layer laminated on the substrate and including an inter-layer insulating layer and a conductor layer laminated on the inter-layer. The substrate has opening penetrating through the insulating layer such that surface of the conductor layer in the substrate is forming bottom of the opening, the substrate has a via conductor formed in the opening and including plating filling the opening, the conductor layer in the substrate includes a metal foil, the conductor layer in the build-up layer includes a metal foil, and the metal foil in the substrate has surface in contact with the surface of the insulating layer such that the surface of the metal foil in the substrate has surface roughness smaller than surface roughness of surface of the metal foil in the build-up layer.

20 Claims, 7 Drawing Sheets

WIRING BOARD AND METHOD FOR MANUFACTURING THE SAME

CROSS-REFERENCE TO RELATED APPLICATIONS

The present application is based upon and claims the benefit of priority to Japanese Patent Application No. 2014-227092, filed Nov. 7, 2014, the entire contents of which are incorporated herein by reference.

BACKGROUND OF THE INVENTION

Field of the Invention

The present invention relates to a wiring board having a core substrate and a build-up layer and a method for manufacturing the same. More particularly, it relates to a highly reliable printed wiring board securely bonding a via-conductor with a metal foil on the core substrate and a method for manufacturing the same.

Description of Background Art

International publication WO 2011/122246 describes a wiring board having a core substrate that is formed by a double-sided copper-clad laminated sheet, a via-conductor formed by filling an opening with copper, and a build-up part formed of a resin insulating layer and a conductor layer alternately laminated. The entire contents of this publication are incorporated herein by reference.

SUMMARY OF THE INVENTION

According to one aspect of the present invention, a wiring board includes a core substrate including a core insulating layer and a conductor layer formed on a surface of the core insulating layer, and a build-up layer laminated on one side of the core substrate and including an inter-layer insulating layer and a conductor layer laminated on the inter-layer insulating layer. The core substrate has an opening portion penetrating through the core insulating layer such that a surface of the conductor layer in the core substrate is forming a bottom surface of the opening portion, the core substrate has a via conductor formed in the opening portion and including plating material filling the opening portion, the conductor layer in the core substrate includes a metal foil and a plating film formed on the metal foil in the core substrate, the conductor layer in the build-up layer includes a metal foil and a plating film formed on the metal foil in the build-up layer, and the metal foil in the core substrate has a surface in contact with the surface of the core insulating layer such that the surface of the metal foil in the core substrate is set to have a surface roughness which is smaller than a surface roughness of a surface of the metal foil in the build-up layer in contact with the inter-layer insulating layer.

According to another aspect of the present invention, a method for manufacturing a wiring board includes laminating a first metal foil having a first roughened surface on one side of a core insulating layer such that the first roughened surface faces the core insulating layer, forming an opening portion in the core insulating layer such that the opening portion penetrates through the core insulating layer and that the first roughened surface of the first metal foil forms a bottom surface of the opening portion, filling plating material into the opening portion of the core insulating layer such that a via conductor including the plating material is formed in the opening portion in contact with the first metal foil, laminating an inter-layer insulating layer on the core insulating layer, and laminating a second metal foil having a second roughened surface on the inter-layer insulating layer such that the second roughened surface faces the inter-layer insulating layer. The first roughened surface of the first metal foil has a surface roughness which is smaller than a surface roughness of the second roughened surface of the second metal foil.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
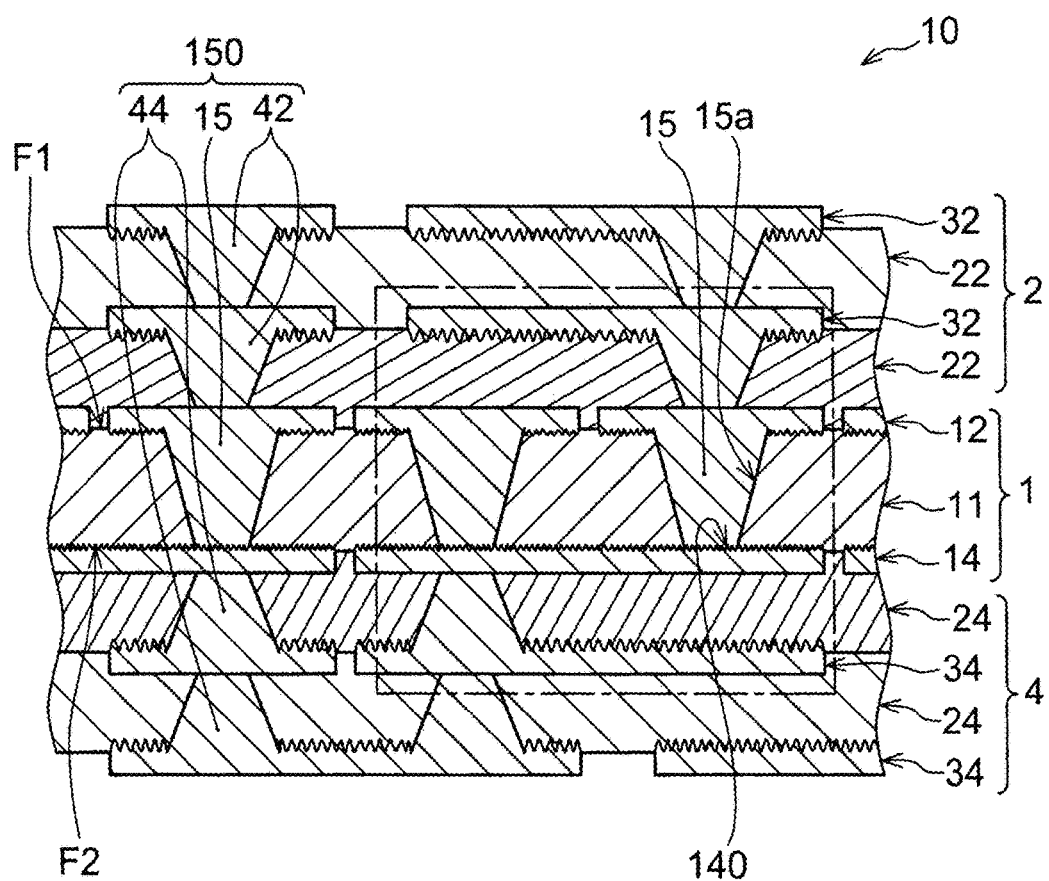
FIG. 1 is the cross sectional view of the printed wiring board of an embodiment in the present invention.

The embodiments will now be described with reference to the accompanying drawings, wherein like reference numerals designate corresponding or identical elements throughout the various drawings.

Figure 2:
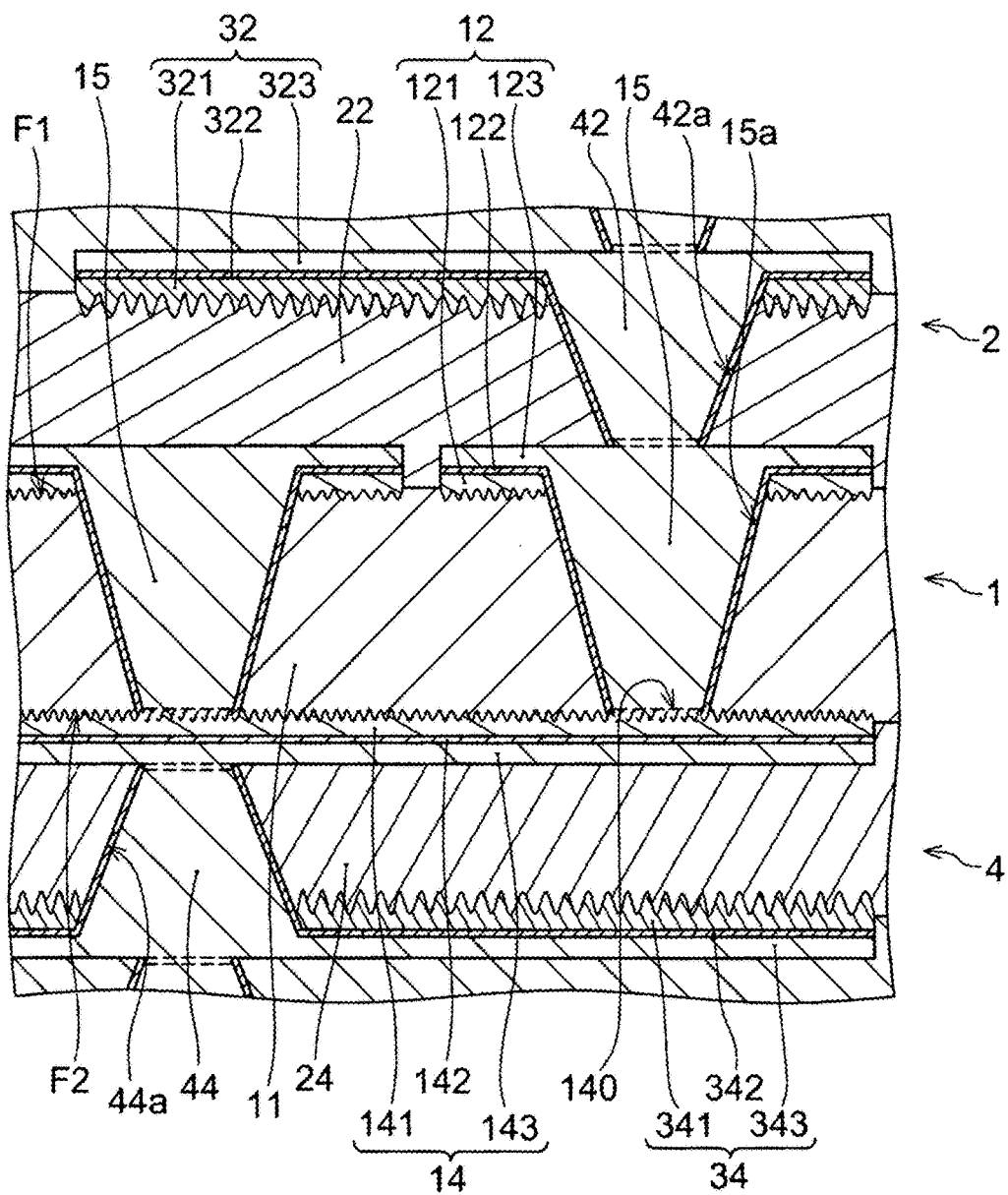
FIG. 2 is an enlarged picture of the core substrate vicinity area of the printed wiring board illustrated in FIG. 1.

With reference to drawings, a wiring board according to an embodiment of the present invention will be explained. As illustrated in FIG. 1, a wiring board 10 according to an embodiment of the present invention has a core substrate 1 formed of a core insulating layer 11, a first conductor layer 12 formed on first surface (F1) and a second conductor layer 14 formed on second surface (F2) of the core insulating layer 11; and build-up layers (2, 4) that are constituted by laminating at least one set of inter-layer insulating layer and conductor layer on at least one side of core substrate 1 (surface (F1) side and second surface (F2) side in examples illustrated in FIG. 1 and FIG. 2, respectively). In the present embodiment, as illustrated in FIG. 1, build-up layer 2 has two sets of an inter-layer insulating layer 22 and conductor layer 32 laminated, and build-up layer 4 has two sets of inter-layer insulating layer 24 and conductor layer 34 laminated. Core insulating layer 11 has opening (15a) and a via-conductor 15 formed in opening (15a) by filling opening (15a) with a plating film. Opening (15a) is penetrating through core insulating layer and has the bottom surface which is surface (140) of second conductor layer 14 on core insulating layer 11 side (namely, it does not pierce second conductor layer 14) as second conductor layer 14 is formed on second surface (F2) of core insulating layer 11. Also, as illustrated in FIG. 2, the first and second conductor layers (12, 14) of core substrate 1 include metal foils (121, 141), metal coatings (122, 142) formed on metal foils (121, 141), and plating films (123, 143) formed on metal coatings (122, 142), respectively. Also, each conductor layer (32, 34) in build-up layers (2, 4) includes metal foils (321, 341), metal coatings (322, 342) formed on metal foils (321, 341), and plating films (323, 343) formed on metal coatings (322, 342), respectively. The surface roughness of the surface of second conductor layer 14 on core insulating layer 11 side, namely, surface 140 of metal foil (141) that forms second conductor layer (14) and in contact with second surface (F2) of core insulating layer 11 is set to be less than the surface roughness of surfaces of metal foils (321, 341) that forms conductor layers (32, 34) and in contact with inter-layer insulating layers (22, 24) in build-up layers (2, 4).

Namely, in the present embodiment, the surface roughness of surface 140, which becomes the bottom surface of opening (15a), where via-conductor 15 is formed, is set to be less than the surface roughness of surfaces of metal foils (321, 341) in contact with inter-layer insulating layers (22, 24) in build-up layers (2, 4). Therefore, the bottom surface of opening (15a) becomes a surface which has relatively less unevenness. As a result, resin residue generated in the formation of opening (15a) by irradiation of laser beam remains lesser within relatively deeper recesses. Also, energy absorption of the laser beam by metal foil 141 decreases when metal foil 141 has surface 140 with less unevenness on core insulating layer 11 side, where surface 140 is the bottom surface of opening (15a). Furthermore, as relatively deep recesses on surface 140 decrease, metal foil 141 does not become dotted with microscopic thin areas. Therefore, metal foil 141 is less likely to be torn even when opening (15a) is formed with stronger laser beam. As a result, the generation of resin residues can be reduced by relatively increasing the power of laser beam.

Figure 6A:
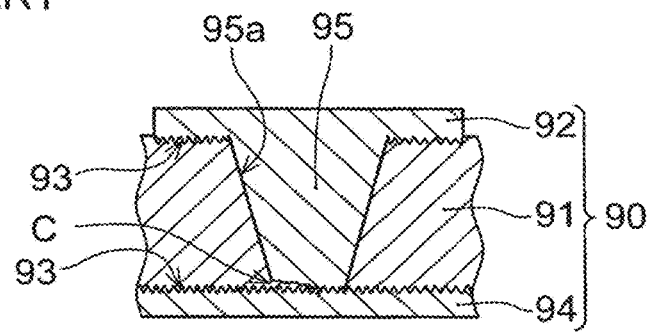
FIG. 6A is the cross sectional view indicating the crack which is generated in a via-conductor in a conventional printed wiring board.

Explanation is described for setting surface 140 of metal foil 141 that forms core substrate 1 to have lower surface roughness than the surfaces of metal foils (321, 341) in contact with inter-layer insulating layers (22, 24) which form build-up layers (2, 4). In a wiring board having a build-up layer formed on a core substrate, when the wiring board is exposed to temperature change during the manufacturing process and usage, stress can be generated between insulating layers and conductor layers or between conductor layers and via-conductors due to differences in their coefficients of thermal expansion between insulating layers mainly of resin compositions and conductor layers and via-conductors mainly of metals. Also, in addition to temperature change, for example, it is thought that an external force is applied to the direction to be bent depending on the way when the wiring board is mounted on an electronic equipment, and even after the installation of the wiring board on electronic equipment, an external force may be applied repetitively and/or continually in relation to differences in coefficient of thermal expansion between the wiring board and its installation surface of electronic equipment, and position precision such as an installation aperture. These stresses tend to be concentrated onto a core layer greater than a build-up layer in the case of a wiring board having a core layer and build-up layer. Build-up layer is formed relatively close to the surface of a wiring board, where its vicinity of the surface has flexibility to expand, contract and displace, whereas a core substrate is not under such circumstance because it does not have flexibility to relieve the stress. Therefore, crack (C) may be generated between via-conductor 95 and conductor layer 94 formed in core substrate 90 of a conventional wiring board as illustrated in FIG. 6A. Also, in this case, crack (C) illustrated in FIG. 6A is not generated between via-conductor 95 and conductor layer 92 but tends to be generated between via-conductor 95 and conductor layer 94, where conductor layer 94 has a narrower joint part with via-conductor 95 than that with conductor layer 92, and stress is easily concentrated on conductor layer 94. In the case of formation of opening (5a), where via-conductor 95 is formed, by the irradiation of laser beam in a method for manufacturing a wiring board as below-mentioned, when the laser is irradiated from conductor layer 92 side, the junction area between conductor layer 94 and via-conductor 95 tends to be less wide than that between conductor 92 and via-conductor 95. Therefore, crack (C) is easily generated at a boundary surface between conductor layer 94 (not conductor layer 92) and via-conductor 95.

On the other hand, laminated plates bonded with metal foils on the surface of insulating layers may be used for core substrates. Metal foils to be bonded with insulating layers, not limited to an insulating layer of a core substrate but including a case for bonding with inter-layer insulating layers (22, 24) as illustrated in FIG. 1, may be roughened on at least one surface to obtain strong bonding with insulating layers, and the roughed surface of metal foil is bonded with an insulating layer facing the insulating layer side. Thus, when a laminated plate having a metal foil bonded on the surface of an insulating layer is used for a core substrate, the surface of the metal foil, namely, conductor layers (92, 94), at least surface 93 of core insulating layer 91 side becomes a roughed surface as illustrated in FIG. 6A. A metal foil is strongly bonded with an insulating layer due to so-called anchor effect, when the surface in contact with the insulating layer is roughened. Strong bonding between the insulating layer and the copper foil can prevent peeling between the insulating layer and wiring pattern, even when the stress described earlier is generated, or contact areas between the individual wiring pattern and the insulating layer decrease, where the wiring pattern is formed in conductor layer with fine pitch in a wiring board.

Also, as illustrated in FIG. 6A, an opening with a bottom such as opening (95a) is formed on core insulating layer 91, where the opening with a bottom has conductor layer 94 as the bottom surface, and it does not pierce conductor layer 94. Then via-conductor 95 may be formed in opening (95a) with a bottom. When the opening on which a via-conductor is formed has a bottom surface, not a piercing hole, it facilitates filling the opening with a conductive material by electro-plating, and makes it easy to increase the freedom of design in a wiring pattern formed on an upper layer of the via-conductor.

Figure 6B:
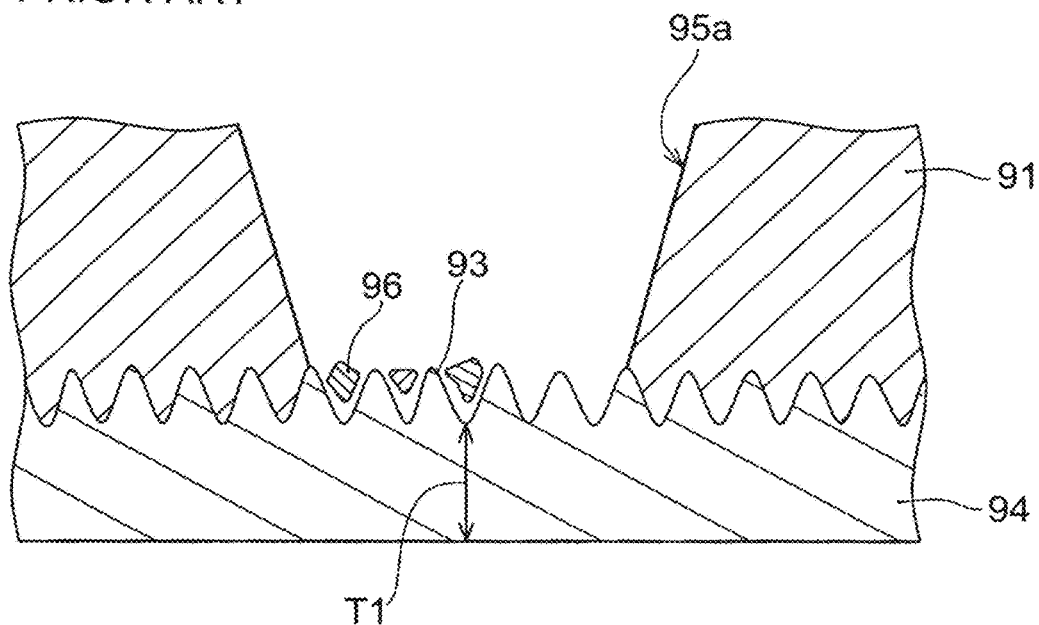
FIG. 6B indicates the resin residue remained at the bottom of the opening in the via-conductor in a conventional printed wiring board.

When laser beam is irradiated from conductor layer 92 side to form opening (95a) with a bottom on core insulating layer 91 illustrated in FIG. 6A, the resin composition in part of core insulating layer 91 irradiated by the laser beam is removed. The surface of conductor layer 94 on core insulating layer 91 side, namely opening (95a), is formed, with roughened surface 93 exposed. Resin residue adheres to the bottom surface (surface 93 having rough surface) of opening (95a) during the formation of this opening (95a). Resin residue is preferably removed by a desmearing process, which is performed later. However, if the surface roughness of the bottom surface (surface 93) of opening (95a) is large, resin residue 96 impregnated inside the recesses on the bottom surface of opening (95a) may remain without being removed, as illustrated in FIG. 6B. When resin residue 96 exists in the bottom surface of opening (95a) in this way, normal connection may not be obtained between via-conductor 95 formed inside of opening (95a) (refer to FIG. 6A) and conductor layer 94. Also, the addition of stress accompanied by ambient temperature changes and external forces, crack (C) may be easily generated at junction part, and connection part may tend to easily rupture. That may leads to decrease in the electrical characteristics and reliability in the wiring board.

Also, increasing the power of laser beam and the number of irradiations as measures for solving such problems may reduce resin residue adhering inside the recesses. However, a high degree of surface roughness on the bottom surface of opening (95a) may result in scattered thin spots in conductor layer 94 as illustrated in FIG. 6B, indicating as T1. Furthermore, the bottom of opening (95a) with high surface roughness may absorb more energy from laser beam. Therefore, increasing the power of laser beam and the number of irradiations may pierce conductor layer 94. Also, such limitation on laser irradiation conditions may not provide sufficient width for the bottom part of opening (95a), namely the width of the junction part between via-conductor 95 and conductor layer 94.

Whereas in build-up layers (2, 4) formed on core substrate 1, the bottom surfaces of openings (42a, 44a) for via-conductors (42, 44) are formed by plating films (123, 143) which form first and second conductor layers (12, 14) on core substrate 1 as illustrated in FIG. 2. Therefore, the surfaces are relatively smooth and have low absorbency for laser beam. Also, as described below, openings (42a, 44a) are formed after plating films (123, 144) are formed via metal coatings (122, 142) on metal foils (121, 141), first and second conductor layers (12, 14) forming the bottom surfaces are also thick. Therefore, a risk of conductor layers (12, 14) being pierced by laser beam irradiation is low. This allows irradiation of laser beam with relatively strong power and an increased number of irradiations. As a result, resin residue hardly remains in the bottom surfaces of openings (42a, 44a), and the width of the bottom part, namely the width of the junction part between via-conductors (42, 44) and the first and second conductor layers (12, 14), are easily enlarged. For these build-up layers (2, 4), a problem, such as crack generated between the via-conductor and the lower conductor layer, hardly occurs. This is similar when inter-layer insulating layers (22, 24) (refer to FIG. 1) are further laminated on conductor layers (32, 34) in build-up layers (2, 4), and via-conductors are formed on insulating layers (22, 24).

Therefore, in a core substrate, the bottom surface of an opening formed by laser beam irradiation is a roughened surface, and the limitations on laser irradiation conditions due to the roughened bottom surface of the opening and the conductor layer forming the bottom surface being a metal foil only, leading residue of core insulating layer more likely to remain on the bottom surface of the opening as compared to a build-up layer. In addition, as set forth above, stress generated on a wiring board and external force applied to the wiring board tend to concentrate onto a core substrate as compared to build-up layer. Therefore, crack (C) is likely to be generated close to the junction between the core conductor layer and the via-conductor, and problems such as increased electrical resistance and decreased reliability are likely to occur, like the junction between via-conductor 95 and conductor layer 94 illustrated in FIG. 6A.

In the present embodiment, as illustrated in FIG. 1 and FIG. 2, not to have these problems occurring, surface 140 of metal foil 141 which constitutes core substrate 1 is set to have smaller roughness than the surfaces of metal foils (321, 341) in contact with inter-layer insulating layers (22, 24) in build-up layer 2. Thus, resin residue hardly remain on the bottom surface of opening (15a) (surface 140 of metal foil 141) by adjusting irradiation conditions of laser beam during the formation of opening (15a). Also, irradiation conditions of laser beam can be flexibly adjusted so that the junction parts between via-conductor 15 and metal foil 141 are enlarged by widening the bottom of opening (15a). Also, even when some resin residue remains, opening (15a) does not have relatively deep recesses on its bottom surface, resin residue can be removed easily by a desmearing treatment. Whereas, in metal foils (321, 341) of build-up layers (2, 4), the surfaces in contact with inter-layer insulating layers (22, 24) have a relatively high surface roughness which is specialized for strong bonding with inter-layer insulating layers (22, 24). Conductor layers (32, 34) in build-up layers (2, 4) may relatively frequently have wiring patterns formed at a fine pitch, and such fine wiring patterns make the contact areas of inter-layer insulating layers (22, 24) small. Thus, it is very beneficial to provide strong adhesiveness with inter-layer insulating layers (22, 24). Thus, according to the present embodiment, residue on the bottom surface of opening (15a) decreases, and secure bonding between via-conductor 15 and metal foil 141, namely second conductor layer 14 which is a conductor layer forming core substrate 1, is easily obtained. Furthermore, the strong adhesiveness between conductor layers (32, 34) and inter-layer insulating layers (22, 24) can be also obtained in build-up layers (2, 4). Therefore, electrical characteristics and reliability of wiring board 10 may be increased.

By lowering the surface roughness of surface 140 of metal foil 141 than the surface roughness of the surfaces of metal foils (321, 341) in contact with inter-layer insulating layers (22, 24) in build-up layers (2, 4), the adhesion with core insulating layer 11 may decrease, but if a degree of roughness is maintained for obtaining an anchor effect as much as before-mentioned, unlike completely smooth surfaces, the effects of improved adhesion with core insulating layer 11 can be obtained as well. Also, on conductor layer of core substrate 1 (the first and second conductor layers (12, 14)), a so-called solid pattern that has a relatively wide area may be formed for a power supply and a GND of an electric circuit in on wiring board 10. In such a case, even if adhesion with core insulating layer 11 decreases to some extent as compared to the case of surface 140 with high roughness, there is no problem at all. Also, other than power supply or GND, by forming a conductor pattern with a relatively wide area in conductor layer of core substrate 1, problem does not occur.

For the surface roughness of the surfaces of metal foils (321, 341) in contact with insulating layers (22, 24) in build-up layers (2, 4), for example, a range of 3.0 to 4.5 µm as ten-point average roughness (Rz) is exemplified. In contrast, for the surface roughness of surface 140 of metal foil 141, a range of 1.0 to 3.0 µm as ten-point average roughness (Rz) is exemplified. By providing such surface roughness, resin residue may decrease while maintaining adhesive improvement effects with insulating layer 11. To obtain such surface roughness for surface 140 of metal foil 141, for example, after the formation of the copper foil, roughening treatment with soft etching and blackening (the oxidation)-reduction treatment may be performed, and the conditions of these treatment can be adjusted accordingly. However, a method for forming a roughened surface for metal foil is not limited to these, but any methods that allow to adjust degree of roughness appropriately may be used.

Also, in FIG. 1 and FIG. 2, not only for metal foil 141 but also for metal foil 121, which forms first conductor 12 formed on first surface (F1) side of core insulating layer 11, the surface of core insulating layer 11 side is set to have smaller surface roughness than the surfaces of metal foils (321, 341) in contact with inter-layer insulating layers (22, 24) in build-up layers (2, 4) (below, smaller surface roughness than the surfaces of metal foils in contact with inter-layer insulating layers in a build-up layer may be simply mentioned as "set to have smaller surface roughness than that of the metal foil of the build-up layer"). Thus, by setting each one of the surfaces of metal foils (metal foils (121, 141)) in contact with first surface (F1) and second surface (F2) of core insulating layer 11 to have smaller surface roughness than metal foil of build-up layer, preferably the surfaces of metal foils (121, 141) in contact with core insulating layer 11 is set to have the same surface roughness with each other, there is no need to recognize that metal foil of which side of core insulating layer 1 has small surface roughness during a manufacturing of wiring board 10, and management and handling of core insulating layer 1 become easier. However, both the metal foils in contact with first surface (F1) and second surface (F2) of core insulating layer 1 may not be set to have smaller surface roughness than metal foil of build-up layer. At least one of the surfaces of metal foils which become the bottom surface of opening (15a) for via-conductor 15 is formed may have the small surface roughness.

Core insulating layer 11 is an insulating layer having first surface (F1) and second surface (F2) which is on the opposite side of first surface (F1). Core insulating layer 11 may be a material formed of a core material, such as fiberglass, and a resin composition containing filler and impregnated into the core material, or a material formed of only a resin composition containing filler. Also, core insulating layer 11 may be formed of one layer or multiple insulating layers. When core insulating layer 11 is formed of multiple insulating layers, for example, coefficient of thermal expansion, flexibility, and thickness can be easily adjusted. For resin, epoxy is exemplified. For the thickness of core insulating layer 11, a thickness range of 25 to 200 µm is exemplified.

In the present embodiment, first conductor layer 12 is formed on first surface (F1) of core insulating layer 11, and second conductor layer 14 is formed on second surface (F2). A method for manufacturing first conductor layer 12 is not particularly limited. In the present embodiment, as illustrated in FIG. 2, first conductor layer 12 includes metal coating 122 and plating film 123 in addition to the above-mentioned metal foil 121. Metal coating 122 is formed on metal foil 121 and opening (15a). Metal coating 122 becomes a feeding layer when plating film 123 is formed by an electro-plating method, as described later in a method for manufacturing wiring board 10. A method for forming metal coating 122 is not particularly limited, but metal coating 122 may be formed by methods such as electroless-plating, vacuum vapor deposition and sputtering. Plating film 123 is formed by an electro-plating method, preferably using metal coating 122 as feeding layer. Plating film 123 is formed on metal coating 122, and forms first conductor layer 12 along with metal foil 121 and metal coating 122. In addition, plating film 123 is also formed inside opening (15a), and forms via-conductor 15 along with metal coating 122.

In the present embodiment, second conductor layer 14 is formed substantially in the same way as first conductor layer 12. Namely, second conductor layer 14 includes a metal coating 142 and plating film 143 in addition to metal foil 141. Metal coating 142 is formed on metal foil 141. Metal coating 142 works as a feeding layer when plating film 143 is formed by an electro-plating method. A method for manufacturing metal coating 142 is not particularly limited, but metal coating 142 may be formed by methods such as electroless plating, vacuum vapor deposition and sputtering. Plating film 143 is formed by an electro-deposition method, preferably using metal coating 142 as a feeding layer. Plating film 143 is formed on metal coating 142, and forms second conductor layer 14 along with metal foil 141 and metal coating 142.

For a material that forms first and second conductor layers (12, 14), copper may be exemplified. Copper is easily formed by a method such as electro-plating, and its resistance is small. Thickness of first and second conductor layers (12, 14) may be, for example, 15 to 35 µm, and thickness of metal foils (121, 141) may be, for example, 5 to 15 µm. In the present embodiment, as set forth above, the surface of metal foil 141 in contact with core insulating layer 11 is set to have smaller surface roughness than the surface of metal foils (321, 341) in build-up layers (2, 4). In addition, as illustrated in FIG. 1 and FIG. 2, the surface of metal foil 121 in contact with core insulating layer 11 and forming first conductor layer 12 may be set to have smaller surface roughness than metal foils (321, 341) in build-up layers (2, 4), and may have the same surface roughness as surface 140 of metal foil (141) in contact with core insulating layer 11.

Via-conductor 15 is penetrating through core insulating layer 11, and electrically connecting first conductor layer 12 and second conductor layer 14. In the present embodiment, via-conductor 15, as described in a below-mentioned manufacturing method, is formed by forming bottomed-opening (15a) having metal foil 141 as the bottom surface through laser irradiation processing applied from the top of metal foil 121 mounted on first surface (F1) of core insulating layer 11, and filling opening (15a) with a conductor. For a material of via-conductor 15, copper may be exemplified. Via-conductor 15 is formed preferably at the same time when metal coating 122 and plating film 123 of first conductor layer 12 are formed.

Opening (15a) for forming via-conductor 15 is formed by irradiating laser beam upon core insulating layer 11 from the metal foil 121 side. Thus, as illustrated in FIG. 2, in a cross sectional structure of opening (15a), first surface (F1) side is wider than second surface (F2) side of core insulating layer 11. As a result, the junction between via-conductor 15 and metal foil 141 of second conductor layer 14 is narrower than the junction between metal foil 121 and first conductor layer 12. Therefore, the stress generated between via-conductor 15 and first and second conductor layers (12, 14) tends to concentrate on the junction with metal foil 141. In the present embodiment, as set forth above, irradiation conditions of laser beam may be adjusted such that the width of the bottom surface of opening (15a) is increased, thereby the width of the junction between via-conductor 15 and metal foil 141 is increased. Moreover, by reducing resin residue on the bottom surface of opening (15a), even if the junction is small, a strong bonding between via-conductor 15 and metal foil 141 can be achieved.

In the present embodiment, two sets of inter-layer insulating layers 22 and conductor layers 32 are laminated to form build-up layer 2, and two sets of inter-layer insulating layers 24 and conductor layers 34 are laminated to form build-up layer 4. Similar to core insulating layer 11, inter-layer insulating layers (22, 24) may be a material formed of a core material such as fiberglass, and a resin composition containing filler and impregnating the core material, or a material formed of only a resin composition containing filler. Conductor layers (32, 34) are formed on inter-layer insulating layers (22, 24), respectively. As illustrated in FIG. 2, in the present embodiment, conductor layers (32, 34) are formed of metal foils (321, 341), metal coatings (322, 342) formed on metal foils (321, 341), and plating films (323, 343) formed on metal coatings (322, 342), respectively. Metal foils (321, 341), for example, are bonded with inter-layer insulating layers (22, 24) by laminating on inter-layer insulating layers (22, 24), heating and pressing. The surfaces of metal foils (321, 341) in with inter-layer insulating layers (22, 24) are roughened to achieve high adhesion to inter-layer insulating layers (22, 24), and are set to have larger surface roughness than the surfaces of metal foils (121, 141) in contact with core insulating layer (11) and forming first and second conductor layers (12, 14), respectively. Metal coatings (322, 342) work as feeding layers, when plating films (323, 343) are formed by an electro-plating method. A method for manufacturing metal coatings (322, 342) is not particularly limited, and they may be formed by methods such as electroless-plating, vacuum vapor deposition, and sputtering. Plating films (323, 343) are preferably formed by an electro-plating method. Plating films (323, 343) form conductor layers (32, 34) along with metal foils (321, 341) and metal coatings (322, 342). Also, plating films (323, 343) are formed inside openings (42a, 44a), and form via-conductors (42, 44) along with metal coatings (322, 342). Via-conductors (42, 44) are penetrating through inter-layer insulating layers (22, 24), and are connecting conductor layers formed on both sides of inter-layer insulating layers (22, 24). Via-conductors (42, 44) are formed of plating films (123, 143) of conductor layers on core substrate 1 (first and second conductor layers (12, 14)) or metal coatings (322, 342) and plating films (323, 343) filled in openings (42a, 44a) having plating films (323, 343) of conductor layers (32, 34) in build-up layers (2, 4) at their bottoms.

In the present embodiment, as illustrated in FIG. 1, laminated body 150 of the via-conductors is formed by forming via-conductor 15 penetrating through core insulating layer 11 and via-conductors 42, 44 penetrating through inter-layer insulating layers (22, 24) in a stacked manner. Laminated body 150 of the via-conductors is connecting conductor layer 32 formed on the surface of build-up layer 2 side and conductor layer 34 formed on the surface of build-up layer 4 side in wiring board 10. By forming laminated body 150 of the via-conductors as such, there are advantages that a process for forming through-holes penetrating through all the layers may not be set up separately, and that the total projected areas of the via-conductors formed in each layer become small for connecting conductor layers formed on both sides of wiring board 10. On the other hand, in such a laminated body 150 of the via-conductors, via-conductors (15, 42, 44) mainly made of metals are connecting from one surface to the other surface of wiring board 10 without a resin layer in between, large stress is likely to be generated on laminated body 150 due to difference in coefficients of thermal expansion with respect to core insulating layer 11 and inter-layer insulating layers (22, 24). As set forth above, such stress tends to concentrate in the vicinity of via-conductor 15 in core substrate 1. In the present embodiment, surface 140 of metal foil 141 is set to have smaller surface roughness than metal foils (321, 341) of build-up layers (2, 4), and thus the junction between via-conductor 15 and metal foil 141 (refer to FIG. 2) where stress is likely to concentrate is securely bonded. Therefore, cracks and rupture are less likely to be formed in the junction area between via-conductor 15 in laminated body 150 of the via-conductors and second conductor layer 14.

In the present embodiment, two conductor layers 32 are laminated in build-up layer 2, and two conductor layers 34 are laminated in build-up layer 4. In the examples illustrated in FIG. 1 and FIG. 2, the surfaces of metal foils (121, 141) in contact with core insulating layer 11 and forming first and second conductor layers (12, 14) are set to have smaller surface roughness than the surfaces of conductor layers (32, 34) in contact with inter-layer insulating layers (22, 24). By setting the surfaces of metal foils (121, 141) in contact with core insulating layer 11 to have smaller surface roughness than all metal foils (321, 341) of conductor layers (32, 34) formed in build-up layers (2, 4) as such, it is preferable in that secured bonding between via-conductor 15 of core substrate 1 and first and second conductor layers (12, 14) is achieved, and that strong adhesion between all conductor layers (32, 34) in build-up layer (2, 4) and inter-layer insulating layers (22, 24). However, the surface of metal foil in contact with core insulating layer and forming a core substrate may be set to have smaller roughness than at least one metal foil in the build-up layers. For example, a conductor layer formed on the surface of a build-up layer may be required to have strong adhesion with an inter-layer insulating layer to mount an electronic component, but other conductor layers in the build-up layer may not require such strong adhesion. In such case, the surface of metal foil in contact with core insulating layer and forming conductor layer of the core substrate may be set to have smaller roughness than metal foil of conductor layer which is required to have strong adhesion, and may have, for example, a same degree of roughness as the surfaces of metal foils in other conductor layers in contact with inter-layer insulating layers in build-up layer.

Figure 3:
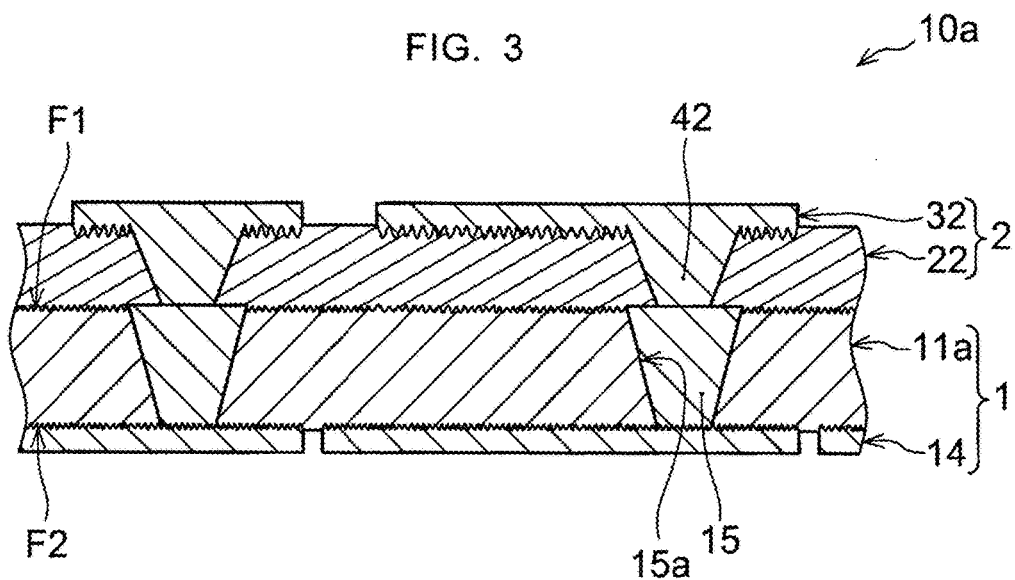
FIG. 3 is the cross sectional view of the printed wiring board of another embodiment in the present invention.

In the present embodiment, as illustrated in FIG. 1, opening (15a) for forming via-conductor 15 is formed in core insulating layer 11, second conductor layer 14 which forms the bottom surface of opening (15a) is formed on second surface (F2) of core insulating layer 11, and via-conductor 15 is connecting second conductor layer 14 and first conductor layer 12 formed on first surface (F1). However, first conductor layer 12 may not be necessary. For example, it may be removed after the formation of via-conductor 15. In other embodiment, one example of wiring board (10a) is illustrated in FIG. 3. In the example illustrated in FIG. 3, similar to the above-mentioned wiring board 10) in one embodiment, second conductor layer 14 is formed on second surface (F2) of core insulating layer (11a), and the surface of second conductor layer 14 in contact with core insulating layer (11a) is set to have smaller surface roughness than the surface of conductor layer 32 in contact with inter-layer insulating layer 22 in build-up layer 2. However, in the embodiment illustrated in FIG. 3, conductor layer is not formed on first surface (F1) of core insulating layer 11b. Also, via-conductor 15 is connected to via-conductor 42 and connected to second conductor layer 14 and conductor layer 32 in build-up layer 2 along with via-conductor 42. When signal line pattern forming a microstripline in conductor layer 32 is formed, the distance between conductor layer 32 and conductor layer (second conductor layer 14 illustrated in the example of FIG. 3) as a shield layer for the microstripline may be required to be within a predetermined range such that the signal line has a desired characteristic impedance. In such a case, as illustrated in FIG. 3, the distance between conductor layer 32 and second conductor layer 14 may be adjusted by laminating insulating layer (core insulating layer (11a) and inter-layer insulating layer 22 in the example illustrated in FIG. 3) without conductor layer in between. Even in the structure illustrated in FIG. 3, a secured junction between via-conductor 15 and second conductor layer 14 may be achieved, and the strong adhesion between conductor layer 32 and inter-layer insulating layer 22 may be obtained. Like a method for manufacturing wiring board 10 in one of the below-mentioned embodiments, in the case where a double-sided copper-clad lamination is used as core substrate 1, for example, after the formation of via-conductor 15, copper foil 121 on first surface (F1) side (refer to FIG. 5C), and metal coating 122 and plating film 123 formed in the formation of the via-conductor are removed entirely by a method such as etching, there manufacturing wiring board (10a) in FIG. 3.

Also, another embodiment illustrated in FIG. 3 is different from wiring board 10 in the embodiment illustrated in FIG. 1 and FIG. 2 in that a build-up layer (build-up layer 2 in one example in FIG. 3) is formed only on first surface (F1) side of core insulating layer (11a). Even in such a structure, by setting the surface of second conductor layer 14 in contact with core insulating layer (11a) to have smaller roughness than the surface of conductor layer 32 in contact with inter-layer insulating layer 22 in build-up layer (2), secured bonding between via-conductor 15 and second conductor layer 14 can be obtained and strong adhesion between conductor layer 32 and inter-layer insulating layer 22 can be obtained.

Figure 4:
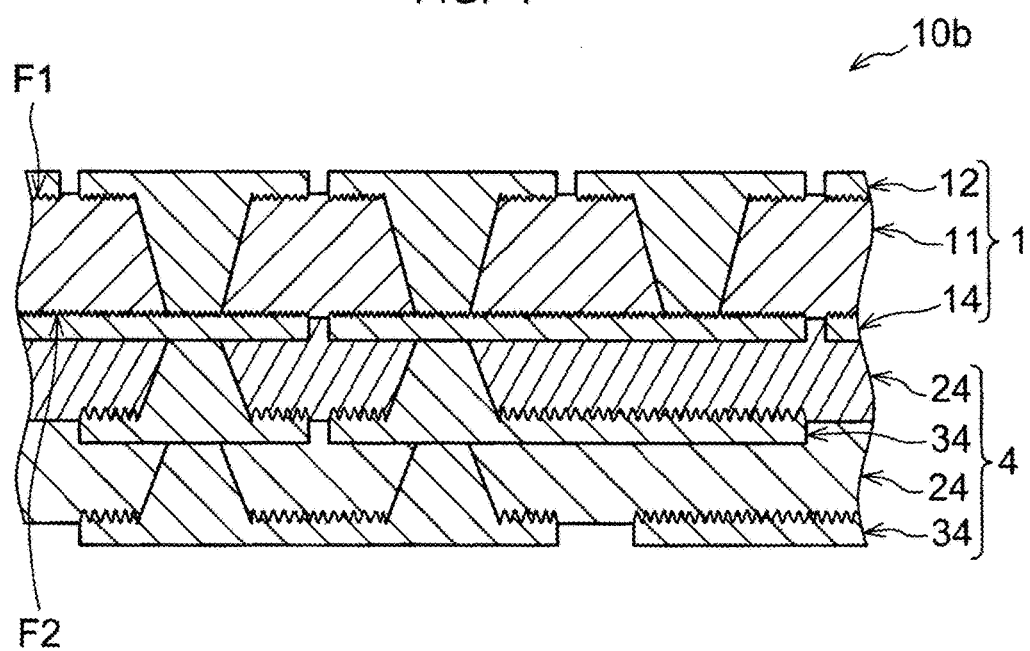
FIG. 4 is the cross sectional view of the printed wiring board of another embodiment in the present invention.

Similarly, like wiring board (10c) in another embodiment illustrated in FIG. 4, a build-up layer (build-up layer 4 is exemplified in FIG. 4) may be formed only on second surface (F2) side on which second conductor layer 14 is formed as the bottom surface of opening (15a). Even in such a structure, by setting the surface of second conductor layer 14 in contact with core insulating layer 11 to have smaller roughness than the surface of conductor layer 34 in contact with inter-layer insulating layer 24 in build-up layer 4, secure bonding between via-conductor 15 and second conductor layer 14 can be obtained, and strong adhesion between conductor layer 34 and inter-layer insulating layer 24 may be obtained. FIG. 4 shows two conductor layers 34 and two inter-layer insulating layers 24 are laminated to form build-up layer 4, the numbers of conductor layer 34 and inter-layer insulating layers 24 in build-up layer 4 may be more or less than two.

Next, referring to FIG. 5A-5H, a method for manufacturing the printed wiring board illustrated in FIG. 1 is explained.

Figure 5A:
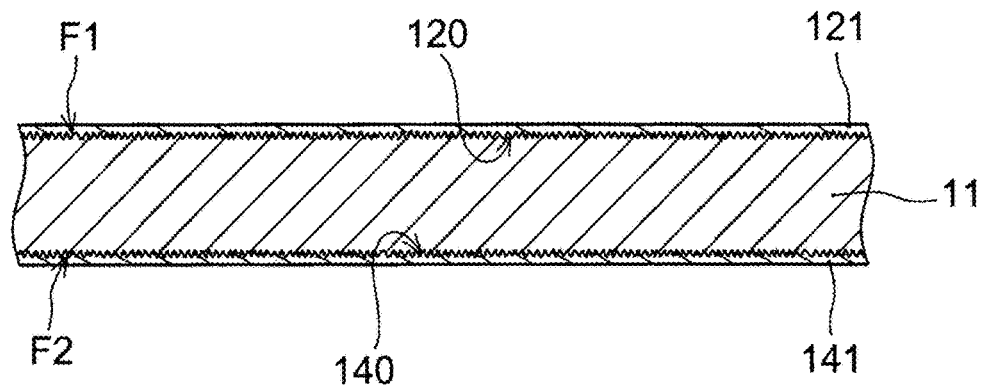
FIG. 5A is an example of an explanatory diagram of each process of the method for manufacturing the printed wiring board illustrated in FIG. 1.

First, as illustrated in FIG. 5A, core substrate 1 formed of insulating layer 11 and metal foils (121, 141) on first surface (F1) and second surface (F2) of core insulating layer (11) is formed. Specifically, for example, a double-sided copper-clad lamination which becomes core substrate 1 is formed by bonding metal foils (121, 141) made of copper with a thickness in a range of 10 to 20 μm on each side of a plate insulating material through a thermos-compression bonding method. At least one side of metal foils (121, 141) (surfaces (120, 140) in FIG. 3A) is subjected to roughening process. Also, among the surfaces undergone the roughening process, at least surface 140 (the first roughened surface) of metal foil 141 (the first metal foil) is subjected to the roughening process to have smaller surface roughness than surfaces (320, 340) (the second roughened surface) of metal foils (321, 341) (the second metal foils) undergone the roughening process, which face inter-layer insulating layers (22, 24) side in FIG. 5E in the below-mentioned formation of conductor layers (32, 34) (refer to FIG. 5G). Metal foils (121, 141) are laminated on core insulating layer 11 such that surfaces (120, 140) undergone roughening process face toward core insulating layer 11, respectively. The roughening treatment of surfaces (120, 140) of metal foils (121, 141), for example, may be conducted by soft etching and blackening (oxidation)-reduction treatment, and the surface roughness is adjusted by changing treatment conditions.

Figure 5B:
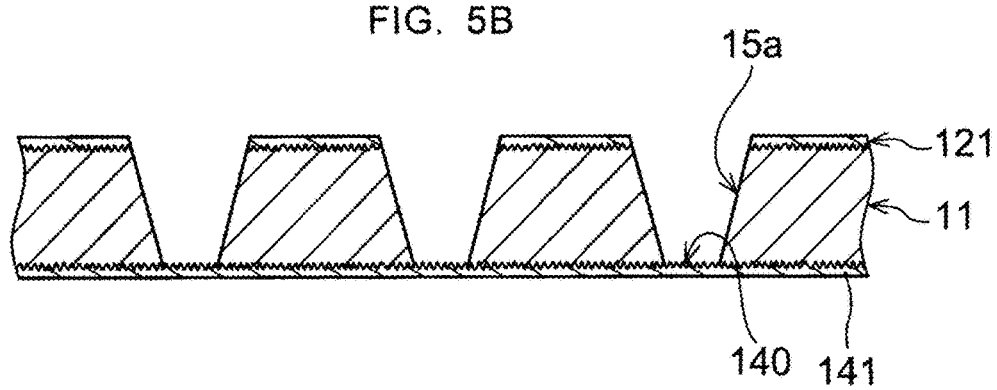
FIG. 5B is an example of an explanatory diagram of each process of the method for manufacturing the printed wiring board illustrated in FIG. 1.

Next, as illustrated in FIG. 5B, opening (15a) is formed. For the formation of opening (15a), for example, laser irradiation may be used. $CO_2$ laser beam may be irradiated upon the surface of metal foil (121) at connection part of first conductor layer 12 and second conductor layer 14 (refer to FIG. 5C) which are to be formed on both sides of core insulating layer 11. Subsequently, it is preferable that desmearing treatment such as immersion in a permanganic acid solution is conducted to dissolve resin residue in opening (15a). The irradiation of laser beam is conducted such that core insulating layer 11 is penetrated through and opening (15a) exposes surface 140 of metal foil 141 on core insulating layer 11 side as the bottom surface of opening (15a). That is, the opening (15a) does not pierce through metal foil 141 and has the bottom. In the present embodiment, as set forth above, surface 140 of metal foil 141 is set to have a roughened surface which has relatively small roughness compares to the surfaces of metal foils (321, 341) undergone roughening process shown in FIG. 5E. Therefore, energy absorption efficiency of laser beam is low, and furthermore, there are fewer parts that are locally thin. Thus, there is less concern that metal foil 141 is pierced, and thus irradiation conditions of laser beam can be adjusted to some extent. Accordingly, the radiation conditions of laser beam can be adjusted such that resin residue is less likely to be adhering to the bottom surface of opening (15a), and/or that the junction area of via-conductor 15 (refer to FIG. 5C) and second conductor layer 14 is enlarged by increasing the width of the bottom surface of opening (15a). By adjusting the laser beam radiation as such, it is more likely that surface 140 of metal foil 141 is completely exposed without resin residue adhering on the bottom surface of opening (15a). In addition, even if resin residue adheres, relatively fewer deep recesses are formed on surface 140 of metal foil 141, and thus it can be more easily removed through the above-mentioned desmear process.

Figure 5C:
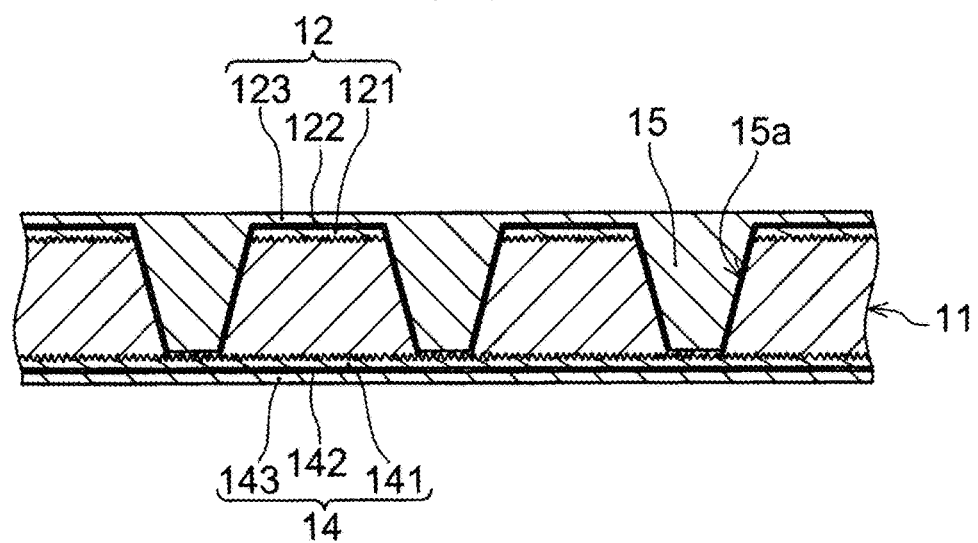
FIG. 5C is an example of an explanatory diagram of each process of the method for manufacturing the printed wiring board illustrated in FIG. 1.

Next, as illustrated in FIG. 5C, metal coatings (122, 142) such as electroless plating film is formed inside opening (15a) and on metal foils (121, 141), and then, plating film 123 on the surface of metal coating 122 and plating film 143 on the surface of metal coating 142 are formed, respectively by, for example, electro-plating. As a result, metal coating 122 and plating film 123 fill inside of opening (15a), and via-conductor 15 formed of metal coating 122 and plating film 123 is formed. The formation of plating films (123, 143) by electro-plating is conducted using metal coatings (122, 142) as feeding layers, respectively. In the present embodiment, as set forth above, irradiation conditions of laser beam can be flexibly adjusted such that resin residue is unlikely to be adhering to the bottom surface of opening (15a), and resin residue can be easily removed even though resin residue is adhering. Thus, via-conductor 15 is likely to be securely connected with metal foil 141.

Figure 5D:
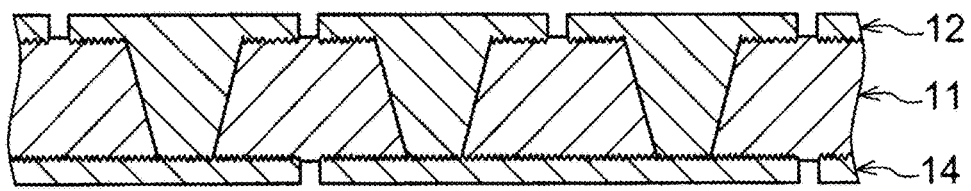
FIG. 5D is an example of an explanatory diagram of each process of the method for manufacturing the printed wiring board illustrated in FIG. 1.

Plating films (123, 143), for example, may be formed on the entire surface of metal coatings (122, 142). In this case, by etching metal foils (121, 141) and metal coatings (122, 142) using a mask formed to have predetermined patterns, first conductor layer 12 and second conductor layer 14 are formed as illustrated in FIG. 5D. Namely, in the present embodiment as illustrated in FIG. 5C, first conductor layer 12 is formed of metal foil 121, metal coating 122 and plating film 123, and second conductor layer 14 is formed of metal foil 141, metal coating 142 and plating film 143. FIG. 5C shows the state before etching, and to explain the layered-structure conveniently, laminated bodies formed of metal foils (121, 141), metal coatings (122, 142) and plating films (123, 143) are indicated as first conductor layer 12 and second conductor layer 14.

A method for forming plating films (123, 143) is not limited to the panel plating method illustrated in FIG. 5C. A resist layer having opening for part which becomes a conductor pattern such as first conductor layer 12 may be formed in advance on metal coatings (122, 142), and subsequently plating films (123, 143) may be formed only in the opening by pattern plating. In this case, first and second conductor layers (12, 14) having predetermined conductor patterns are formed by removing some parts of metal foils (121, 141) and metal coatings (122, 142) through etching after the formation of plating films (123, 143).

Figure 5E:
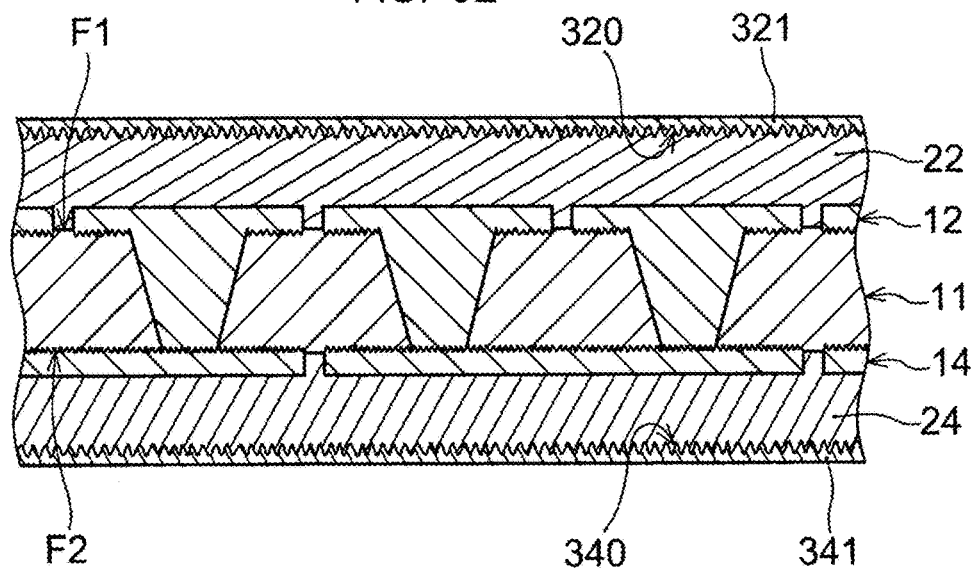
FIG. 5E is an example of an explanatory diagram of each process of the method for manufacturing the printed wiring board illustrated in FIG. 1.

Next, as illustrated in FIG. 5E, inter-layer insulating layer 22 and metal foil 321 are laminated on first conductor layer 12 and first surface (F1) of core insulating layer 11, and inter-layer insulating layers 24 and metal foil 341 are laminated on second conductor layer 14 and second surface (F2) of core insulating layer (11). Then, by applying thermal press bonding, these laminated bodies are formed. Metal foils (321, 341) (second metal foils) have at least one surface (surfaces (320, 340) in FIG. 5E) subjected to surface roughening process, and are laminated such that surfaces (320, 340) (second rough surfaces) undergone the surface roughening process face inter-layer insulating layers (22, 24). As set forth above, at least one of surfaces (320, 340) of metal foils (321, 341) is subjected to surface roughening process to have larger surface roughness than surface 140 (the first rough surface) of metal foil 141 (the first metal foil), resulting in stronger bond with inter-layer insulating layer 22 and/or inter-layer insulating layers 24. Roughening treatment of surfaces (320, 340) of metal foils (321, 341) is conducted, for example, by soft etching and blackening (oxidation)-reduction treatment, and by adjusting treatment conditions, the degree of surface roughness can be adjusted.

For inter-layer insulating layers (22, 24), materials similar to core insulating layer 11 may be used, and either pre-preg having a core material impregnated with resin compositions containing glass fibers or pre-preg which does not contain core material may be used.

Figure 5F:
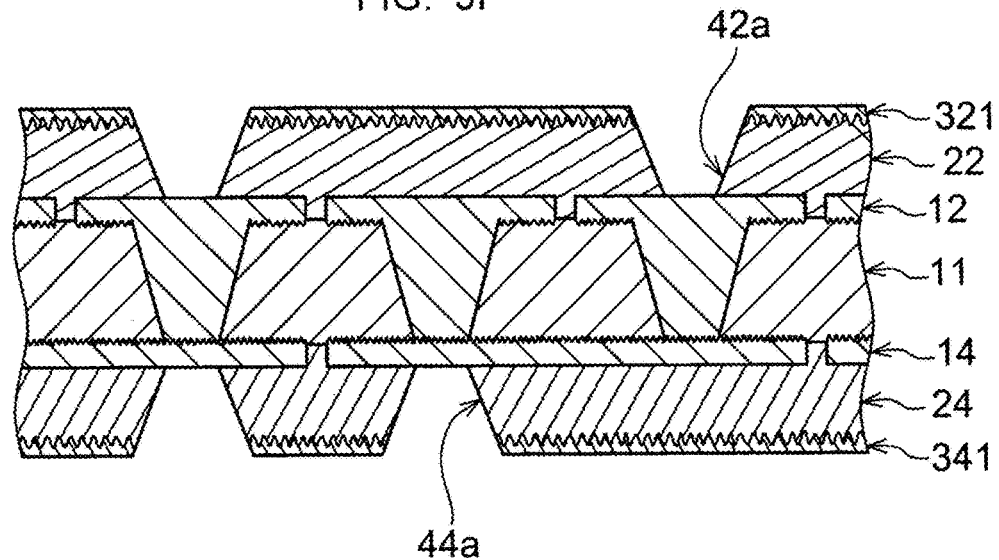
FIG. 5F is an example of an explanatory diagram of each process of the method for manufacturing the printed wiring board illustrated in FIG. 1.

Next, as illustrated in FIG. 5F, openings (42a, 44a) which penetrate through inter-layer insulating layers (22, 24) are formed at the position where via-conductors (42, 44) (refer to FIG. 5G) in inter-layer insulating layers (22, 24) are formed, respectively. Subsequently, preferably, openings (42a, 44a) are subjected to desmearing treatment. A method of laser irradiation may be used to form openings (42a, 44a), similar to the method shown in FIG. 5B mentioned above. Namely, a part where first conductor layer 12 and conductor layer 32 (refer to FIG. 5G) on both surfaces of inter-layer insulating layer 22 are to be connected, and a part in which second conductor layer 14 and conductor layer 34 (refer to FIG. 5G) on both surfaces of inter-layer insulating layer 24 are to be connected are processed by irradiating $CO_2$ laser beam from the surfaces of metal foils (321, 341), respectively.

Figure 5G:
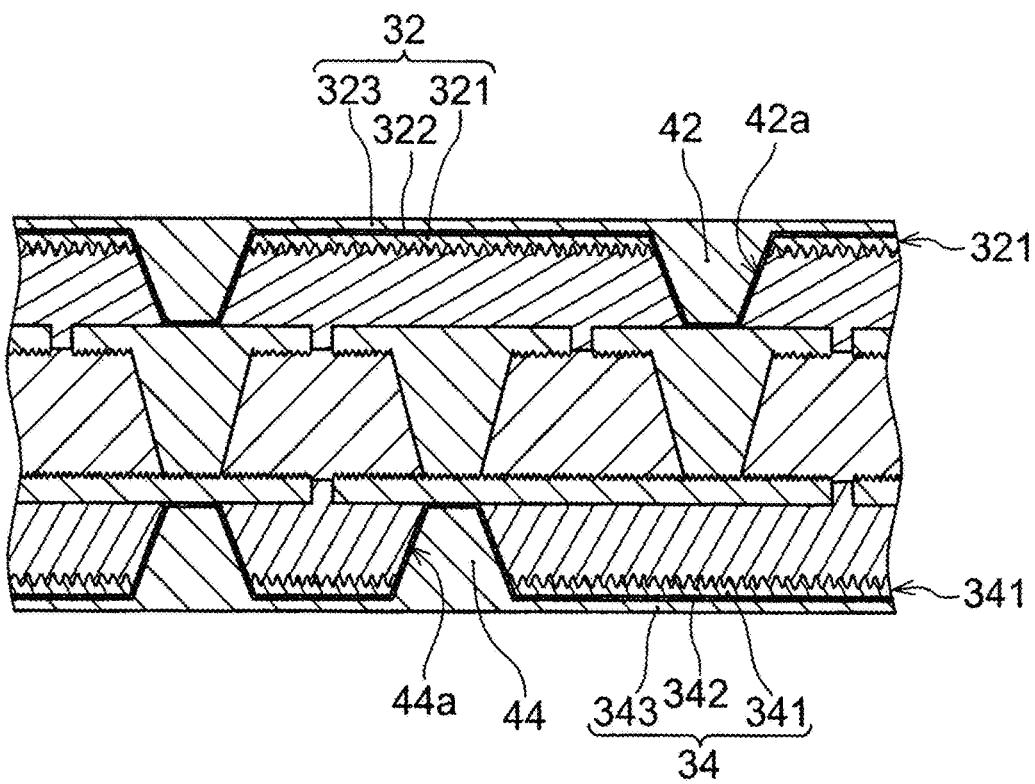
FIG. 5G is an example of an explanatory diagram of each process of the method for manufacturing the printed wiring board illustrated in FIG. 1.

Subsequently, as illustrated in FIG. 5G, metal coatings (322, 342) and plating films (323, 343) are formed, respectively. Namely, similar to FIG. 5C, metal coatings (322, 342) such as an electroless-plating film are formed in opening (42a) and on metal foil 321, and in opening (44a) and on metal foil 341, respectively, and subsequently, plating film 323 on the surface of the metal coating 322 and plating film 343 on the surface of the metal coating 342 are formed, respectively, for example, by electro-plating. As a result, via-conductor 42 is formed by filling metal coating 322 and plating film 323 in opening (42a), and via-conductor 44 is formed by filling metal coating 342 and plating film 343 in opening (44a), respectively.

Figure 5H:
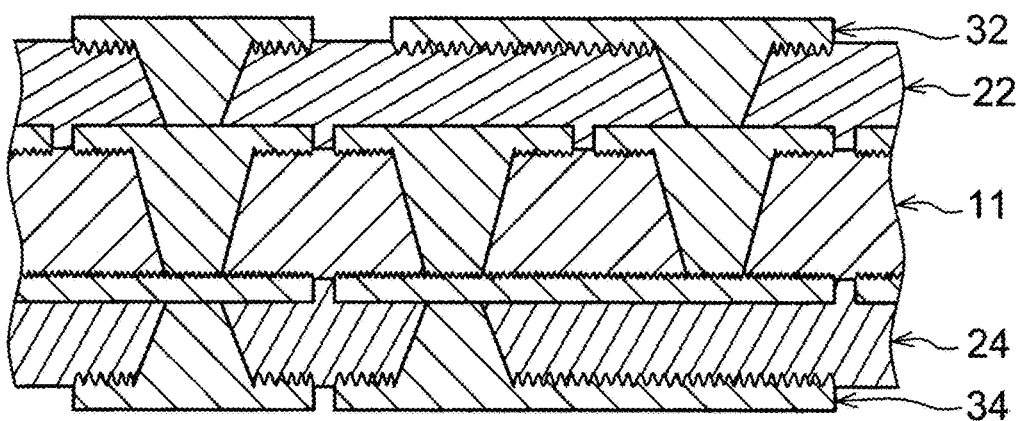
FIG. 5H is an example of an explanatory diagram of each process of the method for manufacturing the printed wiring board illustrated in FIG. 1.

The formation of plating films (323, 343) is conducted using metal coatings (322, 342) as feeding layers, respectively. Plating films (323, 343) are formed, for example, on the entire surfaces of metal coatings (322, 342). In this case, conductor layer 32 and conductor layer 34 are formed by etching metal foils (321, 341) and metal coatings (322, 342) using a mask formed to have predetermined pattern as illustrated in FIG. 5H. Namely, in the present embodiment, as illustrated in FIG. 5G, conductor layer 32 is formed of metal foil 321, metal coating 322 and plating film 323, and conductor layer 34 is formed of metal foil 341, metal coating 342 and plating film 343. FIG. 5G shows the state before etching, and to explain the layered-structure conveniently, laminated bodies formed of metal foils (321, 341), metal coatings (322, 342) and plating films (323, 343) are indicated as first conductor layer 32 and second conductor layer 34. A method for forming plating films (323, 343) is not limited to the panel plating method illustrated in FIG. 5G. A resist layer having opening for part of conductor pattern such as first conductor layer 32 is formed in advance on metal coatings (322, 342), and subsequently plating films (323, 343) may be formed only on the opening by pattern plating. In this case, after the formation of plating films (323, 343), conductor layers (32, 34) with predetermined conductor pattern are formed by removing parts of metal foils (321, 341) and metal coatings (322, 342) through etching and the like.

By repeating the processes illustrated in above-mentioned FIG. 5E-5H, inter-layer insulating layers (22, 24) and metal foils are laminated on both sides, openings are formed in inter-layer insulating layers (22, 24), via-conductors (42, 44) and conductor layers (32, 34) are further formed by applying electroless-plating, electro-plating and patterning. Thus, wiring board 10 having core substrate 1, build-up layer 2 formed of two sets of conductor layers 32 and inter-layer insulating layers 22, and build-up layer 4 formed of two sets of conductor layers 34 and inter-layer insulating layers 24 is obtained, as illustrated in FIG. 1. In the case where build-up layer is formed of one set of conductor layer and inter-layer insulating layer, the repetitive processes illustrated in FIG.

5E-5H may be omitted. In the case where build-up layer is formed of three or more sets of conductor layers and inter-layer insulating layers, the processes illustrated in FIG. 5E-5H may be further repeated as required. In the case where build-up layer is formed only on one side of core substrate 1, the lamination of inter-layer insulating layer and copper foil on the other side of the core substrate may be omitted, and when plating film is formed on one side of the core substrate, the entire surface of the other side may be covered with plating resist.

Subsequently, a solder resist layer may be formed such that the surfaces of exposed conductor layers (32, 34) are protected. Furthermore, surface treatment with coating such as OSP, Ni/Au, Ni/Pd/Au and Sn may be conducted on exposed conductor layers (32, 34) that are not covered with the solder resist layer.

As described above, according to one embodiment exemplified in FIG. 1 and FIG. 2, and another embodiment exemplified in FIG. 3 and FIG. 4, opening (15a) for forming via-conductor 15 in core insulating layer 11 is formed, and surfaces of second conductor layer 14 in contact with core insulating layer 11 and forming the bottom surface of opening (15a) (surface 140 of metal foil 141) is set to have smaller roughness than surfaces of conductor layers (32, 34) in contact with inter-layer insulating layers (22, 24) in build-up layer (2, 4). Thus, even if resin residue is adhering to the bottom surface of opening (15a), which is likely to be generated during the formation of opening (15a) by the laser irradiation, opening (15a) does not have recesses that are relatively deep, and thus resin residue is easily removed by desmearing treatment. Also, a surface of second conductor layer 14, which becomes the bottom surface of opening (15a), is relatively smooth, second conductor layer is less likely to be pieced by irradiation of laser beam, and irradiation condition of laser beam can be adjusted to some extent. Therefore, irradiation conditions of laser beam can be adjusted such that resin residue is hardly adhering to the bottom surface of opening (15a), and/or that the junction area of via-conductor 15 and second conductor layer 14 is increase by enlarging the width of the bottom surface of opening (15a). Therefore, resin residue on the bottom surface of opening (15a) may be reduced. On the other hand, conductor layers (32, 34) of build-up layers (2, 4) have surface roughness which is relatively large on the surfaces in contact with inter-layer insulating layers (22, 24), strong adhesion to inter-layer insulating layers (22, 24) is achieved. Accordingly, secure bonding between via-conductor 15 and second conductor layer (14) forming core substrate 1 is obtained, and furthermore, conductor layers (32, 34) in build-up layers (2, 4) are strongly bonded to inter-layer insulating layers (22, 24). Therefore, electrical characteristics and reliability of wiring board 10 can be increased.

When a wiring board is exposed to changes in surrounding temperature while in use, stress may be generated within each part of the wiring board due to differences in the coefficients of thermal expansion of resin insulating layers, conductor layers and via-conductors. In addition to temperature changes, when a wiring board is fixed to electronic equipment, external forces such as stretching/contracting or bending may be exerted on the wiring board. When such stress is added instantly, continuously or repetitively, cracks may be generated at the boundary between and/or in the vicinity of a copper foil exposed in openings in a resin insulating layer of a core substrate and a via-conductor formed on the copper. Then, electrical resistance between conductor layers in the wiring board may increase, and the reliability of the wiring board may decrease.

A printed wiring board according to an embodiment of the present invention has strong bonding between a via-conductor and copper foil in a core substrate, is less likely to generate cracks near the boundary of these parts when it is subjected to changes in surrounding temperature, and external force, and provides reliable and stable electrical characteristics, and another embodiment of the present invention is a method for manufacturing such a printed wiring board.

A wiring board according to an embodiment of the present invention includes a core substrate formed of a core insulating layer, conductor layers formed on both sides of the core insulating layer, respectively, and a build-up layer including at least one set of an inter-layer insulating layer and a conductor layer laminated on at least one side of the core substrate. The core insulating layer has a via-conductor penetrating through the core insulating layer and formed of a plating film filled in an opening such that the opening has the bottom surface which is the surface of the conductor layer in the core substrate on one side of the core insulating layer. Each of the conductor layer in the core substrate and the conductor layer in the build-up layer includes a metal foil and a plating film formed on the metal foil. The surface of the metal foil in contact with the one side of said core insulating layer and forming the conductor layer in the core substrate is set to have smaller surface roughness than the surface of the metal foil in contact with the inter-layer insulating layer and forming the conductor layer in build-up layer.

A method for manufacturing a wiring board according to another embodiment of the present invention includes laminating a first metal foil having a first roughened surface on at least one side of a core insulating layer such that the first roughened surface faces the core insulating layer, forming an opening penetrating through the core insulating layer such that the opening has a bottom surface which is the first metal foil on the core insulating layer; applying plating such that a via-conductor including a plating film filling the opening is formed in contact with the first metal foil, laminating an inter-layer insulating layer on at least one side of the core insulating layer, laminating a second metal foil having a second roughened surface on the inter-layer insulating layer such that the second roughened surface faces the inter-layer insulating layer, and forming an opening in the inter-layer insulating layer such that the opening penetrates through the inter-layer insulating layer, and filling the opening in the inter-layer insulating layer with a plating film. The first roughened surface has surface roughness which is smaller than surface roughness of the second roughened surface.

According to an embodiment of the present invention, the excellent adhesion of the conductor layer in the build-up layer may be obtained, and at the same time, the surface of the copper foil at the boundary between the via-conductor in the core substrate and the copper foil is set to have smaller roughness than the surface of the copper foil in the build-up layer, and thus cracks is less likely to be generated in the core substrate at the boundary where the core substrate is likely to generate cracks due to the concentration of stress in the wiring board. As a result, the reliability of a wiring board can be improved.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
    a core substrate comprising a core insulating layer and a conductor layer formed on a surface of the core insulating layer; and
    a build-up layer laminated on one side of the core substrate and comprising an inter-layer insulating layer and a conductor layer laminated on the inter-layer insulating layer,
    wherein the core substrate has an opening portion penetrating through the core insulating layer such that a surface of the conductor layer in the core substrate is forming a bottom surface of the opening portion, the core substrate has a via conductor formed in the opening portion and comprising plating material filling the opening portion, the conductor layer in the core substrate comprises a metal foil and a plating film formed on the metal foil in the core substrate, the conductor layer in the build-up layer comprises a metal foil and a plating film formed on the metal foil in the build-up layer, and the metal foil in the core substrate has a surface in contact with the surface of the core insulating layer such that the surface of the metal foil in the core substrate is set to have a surface roughness which is smaller than a surface roughness of a surface of the metal foil in the build-up layer in contact with the inter-layer insulating layer.

2. A wiring board according to claim 1, further comprising:
    a second build-up layer formed on an opposite side of the core substrate with respect to the build-up layer.

3. A wiring board according to claim 1, wherein the surface roughness of the metal foil in the core substrate is the smallest with respect to all metal foils in conductor layers in contact with inter-layer insulating layers in the build-up layer.

4. A wiring board according to claim 1, wherein the opening portion of the core substrate is formed such that a first opening of the opening portion on the surface of the core insulating layer is smaller than a second opening of the opening portion on an opposite surface of the core insulating layer.

5. A wiring board according to claim 1, wherein the build-up layer has a via conductor formed in the inter-layer insulating layer such that the via conductor in the build-up layer is stacked on the via conductor formed in the core substrate and connected to a conductor layer formed at an outermost position in the build-up layer.

6. A wiring board according to claim 1, wherein the core substrate comprises a second conductor layer comprising a metal foil and a plating film formed on the metal foil of the second conductor layer such that the second conductor layer is formed on a second surface of the core insulating layer on an opposite side with respect to the conductor layer on the surface of the core insulating layer, and the metal foil of the second conductor layer has a surface having a surface roughness substantially equal to the surface roughness of the metal foil of the conductor layer in the core substrate.

7. A wiring board according to claim 1, wherein the core insulating layer comprises a core material and a resin material impregnated in the core material.

8. A wiring board according to claim 1, wherein the build-up layer has a via conductor formed in the inter-layer insulating layer such that the via conductor in the build-up layer is stacked on the via conductor formed in the core substrate.

9. A wiring board according to claim 1, wherein the core substrate comprises a second conductor layer comprising a metal foil and a plating film formed on the metal foil of the second conductor layer such that the second conductor layer is formed on a second surface of the core insulating layer on an opposite side with respect to the conductor layer on the surface of the core insulating layer.

10. A wiring board according to claim 2, wherein the build-up layer has a via conductor structure formed through the build-up layer such that the via conductor structure in the build-up layer is stacked on the via conductor formed in the core substrate, the second build-up layer has a second via conductor structure formed through the second build-up layer such that the second via conductor structure in the second build-up layer is stacked on the via conductor formed in the core substrate, and the via conductor, the via conductor structure and the second via conductor structure are formed such that the via conductor, the via conductor structure and the second via conductor structure are connecting a conductor layer formed at an outermost position in the build-up layer and a conductor layer formed at an outermost position in the second build-up layer.

11. A wiring board according to claim 2, wherein the surface roughness of the metal foil in the core substrate is the smallest with respect to all metal foils in conductor layers in contact with inter-layer insulating layers in the build-up layer and second build-up layer.

12. A wiring board according to claim 2, wherein the opening portion of the core substrate is formed such that a first opening of the opening portion on the surface of the core insulating layer is smaller than a second opening of the opening portion on an opposite surface of the core insulating layer.

13. A wiring board according to claim 2, wherein the build-up layer has a via conductor formed in the inter-layer insulating layer such that the via conductor in the build-up layer is stacked on the via conductor formed in the core substrate and connected to a conductor layer formed at an outermost position in the build-up layer.

14. A wiring board according to claim 2, wherein the core substrate comprises a second conductor layer comprising a metal foil and a plating film formed on the metal foil of the second conductor layer such that the second conductor layer is formed on a second surface of the core insulating layer on an opposite side with respect to the conductor layer on the surface of the core insulating layer, and the metal foil of the second conductor layer has a surface having a surface roughness substantially equal to the surface roughness of the metal foil of the conductor layer in the core substrate.

15. A wiring board according to claim 1, wherein the conductor layer in the core substrate includes a metal coating layer formed on the metal foil such that the plating film is formed on the metal coating layer, and the conductor layer in the build-up layer includes a metal coating layer formed on the metal foil such that the plating film is formed on the metal coating layer.

16. A method for manufacturing a wiring board, comprising:
    laminating a first metal foil having a first roughened surface on one side of a core insulating layer such that the first roughened surface faces the core insulating layer;
    forming an opening portion in the core insulating layer such that the opening portion penetrates through the core insulating layer and that the first roughened surface of the first metal foil forms a bottom surface of the opening portion;

filling plating material into the opening portion of the core insulating layer such that a via conductor comprising the plating material is formed in the opening portion in contact with the first metal foil;

laminating an inter-layer insulating layer on the core insulating layer; and laminating a second metal foil having a second roughened surface on the inter-layer insulating layer such that the second roughened surface faces the inter-layer insulating layer, wherein the first roughened surface of the first metal foil has a surface roughness which is smaller than a surface roughness of the second roughened surface of the second metal foil.

17. A method for manufacturing a wiring board according to claim 16, further comprising:

forming an opening portion in the inter-layer insulating layer such that the opening portion penetrates through the inter-layer insulating layer; and filling plating material into the opening portion formed in the inter-layer insulating layer such that a via conductor is formed in the inter-layer insulating layer.

18. A method for manufacturing a wiring board according to claim 16, further comprising:

forming an opening portion in the inter-layer insulating layer such that the opening portion penetrates through the inter-layer insulating layer and formed on the via conductor formed in the core insulating layer; and filling plating material into the opening portion formed in the inter-layer insulating layer such that a via conductor stacked on the via conductor in the core insulating layer is formed in the inter-layer insulating layer.

19. A method for manufacturing a wiring board according to claim 16, wherein the surface roughness of the first metal foil is the smallest with respect to all metal foils in conductor layers in contact with inter-layer insulating layers in a build-up layer formed on the core insulating layer.

20. A method for manufacturing a wiring board according to claim 16, wherein the forming of the opening portion comprises forming the opening portion such that a first opening of the opening portion on the surface of the core insulating layer is smaller than a second opening of the opening portion on an opposite surface of the core insulating layer.

* * * * *